(12) United States Patent
Seeger

(10) Patent No.: US 12,242,299 B2
(45) Date of Patent: Mar. 4, 2025

(54) SIGNAL SYNTHESIZER CIRCUIT, SIGNAL GENERATOR DEVICE, AND SIGNAL SYNTHESIS METHOD

(71) Applicant: Rohde & Schwarz GmbH & Co. KG, Munich (DE)

(72) Inventor: Julius Seeger, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 238 days.

(21) Appl. No.: 18/052,061

(22) Filed: Nov. 2, 2022

(65) Prior Publication Data

US 2024/0143019 A1 May 2, 2024

(51) Int. Cl.
*G06F 1/08* (2006.01)
*H03L 7/093* (2006.01)

(52) U.S. Cl.
CPC ............... *G06F 1/08* (2013.01); *H03L 7/093* (2013.01)

(58) Field of Classification Search
CPC .................................... G06F 1/08; H03L 7/093
See application file for complete search history.

(56) References Cited

U.S. PATENT DOCUMENTS

| | | | |
|---|---|---|---|
| 5,686,841 A | | 11/1997 | Stolarczyk et al. |
| 6,043,693 A | * | 3/2000 | Thomas ............. H03L 7/00 327/44 |
| 6,111,543 A | | 8/2000 | Le Herisse |
| 6,278,330 B1 | | 8/2001 | Ascarrunz |
| 6,516,023 B1 | | 2/2003 | Kveim et al. |
| 6,977,556 B1 | | 12/2005 | Petrovic et al. |
| 7,158,494 B2 | | 1/2007 | Sander et al. |
| 7,212,585 B2 | | 5/2007 | Cho et al. |
| 8,471,761 B1 | * | 6/2013 | Hogg ............. G01S 13/536 342/194 |
| 8,874,063 B2 | * | 10/2014 | Ko ............. H04B 1/0064 455/313 |
| 9,008,512 B2 | | 4/2015 | Nazarathy et al. |
| 9,049,732 B2 | | 6/2015 | Fourtet et al. |

(Continued)

FOREIGN PATENT DOCUMENTS

| | | |
|---|---|---|
| DE | 4340722 C1 | 4/1995 |
| EP | 1229683 A2 | 8/2002 |

(Continued)

*Primary Examiner* — Aurel Prifti
(74) *Attorney, Agent, or Firm* — CHRISTENSEN O'CONNOR JOHNSON KINDNESS PLLC

(57) ABSTRACT

A signal synthesizer circuit includes a clock source, a direct digital synthesizer (DDS) circuit, signal paths, and an output. The clock source generates or receives a clock signal having a predefined frequency. The DDS circuit generates a DDS signal. A first signal path is connected to the DDS circuit to receive the DDS signal and includes a multiplier circuit that multiplies a frequency of the DDS signal by a multiplication factor, obtaining a frequency-multiplied DDS signal. A second signal path is connected to the clock source to receive the clock signal and includes a mixer circuit that receives the clock signal and the frequency-multiplied DDS signal. The mixer circuit mixes the clock signal with the frequency-multiplied DDS signal, obtaining a mixed DDS signal. A frequency of the mixed DDS signal corresponds to the sum of frequencies of the clock signal and the frequency-multiplied DDS signal.

20 Claims, 2 Drawing Sheets

(56) References Cited

U.S. PATENT DOCUMENTS

| | | | | |
|---|---|---|---|---|
| 10,367,493 B1* | 7/2019 | Addepalli | ............ | H03L 7/0891 |
| 11,811,415 B2* | 11/2023 | Srinivas | .................... | H03L 7/08 |
| 2005/0003785 A1* | 1/2005 | Jackson | ................... | G01S 7/35 |
| | | | | 455/260 |
| 2007/0218850 A1* | 9/2007 | Pan | ......................... | H03D 7/18 |
| | | | | 455/189.1 |
| 2014/0294117 A1* | 10/2014 | Tarleton | ................. | G06F 1/022 |
| | | | | 375/296 |
| 2021/0081204 A1* | 3/2021 | Jeon | .................... | G06F 9/30189 |

FOREIGN PATENT DOCUMENTS

| | | |
|---|---|---|
| EP | 2114045 A1 | 11/2009 |
| KR | 100796200 B1 | 1/2008 |

* cited by examiner

SIGNAL SYNTHESIZER CIRCUIT, SIGNAL GENERATOR DEVICE, AND SIGNAL SYNTHESIS METHOD

FIELD OF THE DISCLOSURE

Embodiments of the present disclosure generally relate to a signal synthesizer circuit. Embodiments of the present disclosure further relate to a signal generator device and to a signal synthesis method.

BACKGROUND

Usually, direct signal synthesis (DDS) based digital synthesizers can only be used up to an output frequency of approximately 40% of the internal clock frequency in order to avoid aliasing effects.

Conversely, the clock frequency has to be approximately 2.5 times higher than the usable output frequency of the DDS synthesizer. However, increasing the clock frequency in the digital architecture of the digital synthesizer increases its power consumption due to stray capacitances which have to be charged and discharged in each clock cycle.

Thus, there is a need for a signal synthesizer circuit and a signal synthesis method that allow for an increased output frequency at a given clock frequency.

SUMMARY

Embodiments of the present disclosure provide a signal synthesizer circuit. The signal synthesizer circuit comprises a clock source, a direct digital synthesizer (DDS) circuit, a first signal path, a second signal path, and an output being connected to the first signal path and the second signal path. The clock source is configured to generate or receive a clock signal having a predefined frequency. The DDS circuit is configured to generate a DDS signal. The first signal path is connected to the DDS circuit so as to receive the DDS signal, wherein the first signal path comprises a multiplier circuit being configured to multiply a frequency of the DDS signal by a multiplication factor, thereby obtaining a frequency-multiplied DDS signal. The second signal path is connected to the clock source so as to receive the clock signal, wherein the second signal path comprises a mixer circuit being connected to the clock source and to the multiplier circuit so as to receive the clock signal and the frequency-multiplied DDS signal. The mixer circuit is configured to mix the clock signal with the frequency-multiplied DDS signal, thereby obtaining a mixed DDS signal, wherein a frequency of the mixed DDS signal corresponds to the sum of frequencies of the clock signal and of the frequency-multiplied DDS signal.

According to the present disclosure, the DDS circuit generates the DDS signal having a frequency $f\_DDS = n \cdot f\_clk$, wherein n is a real number between 0 and 1, particularly between 0 and 0.4, and wherein $f\_clk$ is the frequency of the clock signal.

Accordingly, the frequency-multiplied DDS signal has a frequency $f\_mutt = N \cdot f\_DDS = N \cdot n \cdot f\_clk$, wherein the multiplication factor N is a real number greater than 1.

Thus, the mixed DDS signal has a frequency $f\_mix = f\_clk + f\_mult = (1+N \cdot n) \; f\_clk$. As is immediately obvious, the frequency of the mixed DDS signal is greater than the frequency of the clock signal.

At a given frequency of the clock signal, the signal synthesizer circuit according to the present disclosure provides at least two possible output signals, namely the frequency-multiplied DDS signal and the mixed DDS signal.

Both possible output signals have a frequency that is considerably higher than the frequency of the DDS signal, namely by a factor N>1 in the case of the frequency-multiplied DDS signal, and by a factor $(1+N \cdot n)Vn>N$ in the case of the mixed DDS signal.

Thus, the signal synthesizer circuit according to the present disclosure is capable of generating output signals having higher frequencies than what is achievable at a given clock frequency in the state of the art.

The clock source may be an internal clock source generator circuit of the signal synthesizer circuit, i.e. the clock source may be configured to generate the clock signal.

Alternatively, the clock source may be an input interface being configured to receive the clock signal from an external clock signal generator circuit.

According to an aspect of the present disclosure, the multiplication factor is greater than 2. It has turned out that for N>2, the complete frequency range from $f\_DDS$ to $(1+N \cdot n) \; f\_clk$ can be covered by the DDS signal, the frequency-multiplied DDS signal, and the mixed DDS signal with alias frequency suppression of the alias frequency occurring at approximately 60% of the clock frequency $f\_clk$.

Particularly, the multiplication factor is equal to 3. It has turned out that unwanted harmonics of the mixed DDS signal and/or of the frequency-multiplied DDS signal can be optimally suppressed if the multiplication factor N is equal to 3.

In an embodiment of the present disclosure, a frequency of the DDS signal is equal to or smaller than 40% of a frequency of the clock signal. Accordingly, the parameter n defined above is smaller than or equal to $n\_max = 0.4$.

Accordingly, if an output signal having a frequency between 0 and $0.4 \; f\_clk$ is required, the DDS signal can be used as the output signal of the signal synthesizer circuit.

If an output signal having between $0.4 \; f\_clk$ and $0.4 \; N \cdot f\_clk$ is required, the frequency-multiplied DDS signal can be used as the output signal of the signal synthesizer circuit.

If an output signal having between $0.4 \; N \cdot f\_clk$ and $(1+0.4 \; N) \; f\_clk$ is required, the mixed DDS signal can be used as the output signal of the signal synthesizer circuit.

In other words, the signal synthesizer circuit according to the present disclosure may cover the complete frequency range from 0 to $(1+0.4 \; N) \; f\_clk$.

For example, for the multiplication factor N being equal to 3, the complete frequency range from 0 to $2.2 \; f\_clk$ is covered, which is more than 5 times larger than the frequency range obtainable by the DDS circuit alone.

According to another aspect of the present disclosure, the first signal path comprises an anti-aliasing filter downstream of the DDS circuit. Particularly, the anti-aliasing filter is provided immediately downstream of the DDS circuit. With the anti-aliasing filter, aliasing effects can be removed from the DDS signal, such that the frequency-multiplied DDS signal and the mixed DDS signal are free of aliasing effects originating in the DDS signal.

The anti-aliasing filter may be integrated into the signal synthesizer circuit, or may be integrated onto the same chip as the signal synthesizer circuit.

However, it is also conceivable that the anti-aliasing filter is provided separately from the signal synthesizer circuit, e.g. on a different chip. In this case, the DDS signal is routed to the external anti-aliasing filter, and the corresponding DDS signal filtered by the external anti-aliasing filter is routed back to the signal synthesizer circuit.

Therein and in the following, the term "filter" is understood to denote a filter circuit being configured to perform the described functionality. In fact, the term "filter" may denote a single filter unit, a combination of several filter units, or a filter bank being configured to perform the described functionality.

In a further embodiment of the present disclosure, the first signal path comprises a bandpass filter downstream of the multiplier circuit, wherein the bandpass filter is configured to suppress predefined harmonics and/or predefined subharmonics of the frequency-multiplied DDS signal. Particularly, the bandpass filter is provided immediately downstream of the multiplier circuit.

The bandpass filter may be configured to remove the predefined harmonics and/or the predefined subharmonics of the frequency-multiplied DDS signal from the frequency-multiplied DDS signal. For example, if the bandpass filter removes all harmonics, only the fundamental of the frequency-multiplied DDS signal passes the bandpass filter.

However, it is also conceivable that a particular harmonic or a particular subharmonic is selected by the bandpass filter. In other words, the bandpass filter may remove the fundamental and all other harmonics or subharmonics, such that only the particular harmonic or subharmonic of the frequency-multiplied DDS signal passes the bandpass filter.

A further aspect of the present disclosure provides that the bandpass filter is tunable. In other words, the frequency range of the frequency-multiplied DDS signal passing the bandpass filter can be selected by appropriately tuning the bandpass filter.

For example, the frequency range of the frequency-multiplied DDS signal passing the bandpass filter may be selectable via a user interface.

In an embodiment of the present disclosure, the second signal path comprises a clock bandpass filter upstream of the mixer circuit. Particularly, the clock bandpass filter is provided immediately upstream of the mixer circuit. In general, the clock bandpass filter is configured to filter the clock signal in a predefined manner, such that only desired frequency portions of the clock signal are forwarded to the mixer circuit.

According to an aspect of the present disclosure, the mixer circuit comprises a mixer bandpass filter being configured to select the mixed DDS signal, or a mixer highpass filter being configured to select the mixed DDS signal. When mixing the frequency-multiplied DDS signal with the clock signal, two signals are generated having frequencies $f\_1=|f\_clk—f\_mult|$ and $f\_2=f\_clk+f\_mult$. The mixer bandpass filter or mixer highpass filter is configured to remove the signal having frequency $f\_1$, such that only the signal having frequency $f\_2$, i.e. the mixed DDS signal, is output by the mixer circuit.

In an embodiment of the present disclosure, the signal synthesizer circuit further comprises a third signal path connecting the DDS circuit to the output. In other words, the DDS signal may be forwarded to the output by the third signal path.

In a further embodiment of the present disclosure, the signal synthesizer circuit comprises a selection circuit, wherein the selection circuit is configured to selectively forward the mixed DDS signal and/or the frequency-multiplied DDS signal to the output. In other words, the signal synthesizer circuit is configured to selectively output the mixed DDS signal and/or the frequency-multiplied DDS signal.

For example, a user may select the output signal of the signal synthesizer circuit via a user interface.

The selection circuit may, for example, be configured as a switch or as a combiner with appropriate frequency suppression, such that only the desired signal(s) is (are) output.

If the first signal path and the second signal path comprise at least one amplifier, respectively, the selection circuit may be configured to deactivate an amplifier of the signal path processing an unwanted signal (i.e. a signal that should not be forwarded to the output), or rather set the gain of the respective amplifier to $-\infty$dBFS.

It is also conceivable that the signal synthesizer circuit comprises more than one output, i.e. at least two outputs. In this case, the selection circuit may be established as a multiplexer circuit being configured to selectively forward the mixed DDS signal and/or the frequency-multiplied DDS signal to the at least two outputs, respectively.

The signal synthesizer circuit may further comprises a third signal path connecting the DDS circuit to the output, and a selection circuit, wherein the selection circuit is configured to selectively forward the DDS signal, the mixed DDS signal, and/or the frequency-multiplied DDS signal to the output. In other words, the signal synthesizer circuit is configured to selectively output the DDS signal, the mixed DDS signal and/or the frequency-multiplied DDS signal.

For example, a user may select the output signal of the signal synthesizer circuit via a user interface.

The explanations given above with respect to the selection circuit likewise apply.

According to another aspect of the present disclosure, the DDS signal generated by the DDS circuit is adaptable. A user may adapt the DDS signal via a user interface.

More precisely, a frequency of the DDS signal may be adaptable. For example, the parameter n defining the frequency of the DDS signal according to $f\_DDS=n \cdot f\_clk$ may be adaptable between 0 and $n\_max=0.4$.

The frequency of the DDS signal may be controlled by a frequency tuning word (FTW), wherein the frequency of the DDS signal is equal to $f\_DDS=((FTW) \cdot f\_clk)V2^M$, wherein M is an integer and the FTW has possible (discrete) values between 0 and (M−1).

In an embodiment of the present disclosure, the signal synthesizer circuit is integrated on a chip or on a multi-carrier module. Thus, a particularly compact signal synthesizer circuit is provided.

Particularly, the clock source comprises a voltage-controlled oscillator. In general, the voltage-controlled oscillator may be configured to generate the clock signal.

The voltage-controlled oscillator may be integrated in the signal synthesizer circuit, or may be provided on the same chip as the signal synthesizer circuit.

The multiplier circuit may comprise a frequency doubling circuit and a mixer sub-circuit, wherein the frequency doubling circuit is configured to double the frequency of the DDS signal, thereby obtaining a frequency-doubled DDS signal, and wherein the mixer sub-circuit is configured to mix the DDS signal with the frequency-doubled DDS signal, thereby obtaining the frequency-multiplied DDS signal. As a result, the frequency of the frequency-multiplied DDS signal is equal to the frequency of the DDS signal tripled, i.e. N=3.

However, it is to be understood that the multiplier circuit may be established in any other suitable way. For example, the multiplier circuit may comprise suitable diode circuitry. As another example, the multiplier circuit may comprise an amplifier that is operated in a non-linear amplitude region, such that harmonics of the DDS signal occur. The desired harmonics may be selected by a suitable filter.

Embodiments of the present disclosure further provide a signal generator device. The signal generator device comprises a signal synthesizer circuit described above.

Regarding the advantages and further properties of the signal generator device, reference is made to the explanations given above with respect to the signal synthesizer circuit, which also hold for the signal generator device and vice versa.

Embodiments of the present disclosure further provide a signal synthesis method. The signal synthesis method comprises the steps of:
- generating or receiving, by a clock source, a clock signal having a predefined frequency;
- generating, by a direct digital synthesizer (DDS) circuit, a DDS signal;
- multiplying, by a multiplier circuit, a frequency of the DDS signal by a multiplication factor, thereby obtaining a frequency-multiplied DDS signal; and
- mixing, by a mixer circuit, the clock signal with the frequency-multiplied DDS signal, thereby obtaining a mixed DDS signal, wherein a frequency of the mixed DDS signal corresponds to the sum of the frequencies of the clock signal and of the frequency-multiplied DDS signal.

Particularly, the signal synthesizer circuit described above and the signal generator device described above are configured to perform the signal synthesis method, respectively.

Regarding the advantages and further properties of the signal synthesis method, reference is made to the explanations given above with respect to the signal synthesizer circuit and the signal generator device, which also hold for the signal synthesis method and vice versa.

According to an aspect of the present disclosure, the DDS signal, the frequency-multiplied DDS signal, and/or the mixed DDS signal are selectively forwarded to an output by a selection circuit. For example, a user may select the output signal from the DDS signal, the frequency-multiplied DDS signal, and/or the mixed DDS signal via a user interface.

In an embodiment of the present disclosure, the multiplication factor is equal to 3. It has turned out that unwanted harmonics of the mixed DDS signal and/or of the frequency-multiplied DDS signal can be optimally suppressed if the multiplication factor N is equal to 3.

BRIEF DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
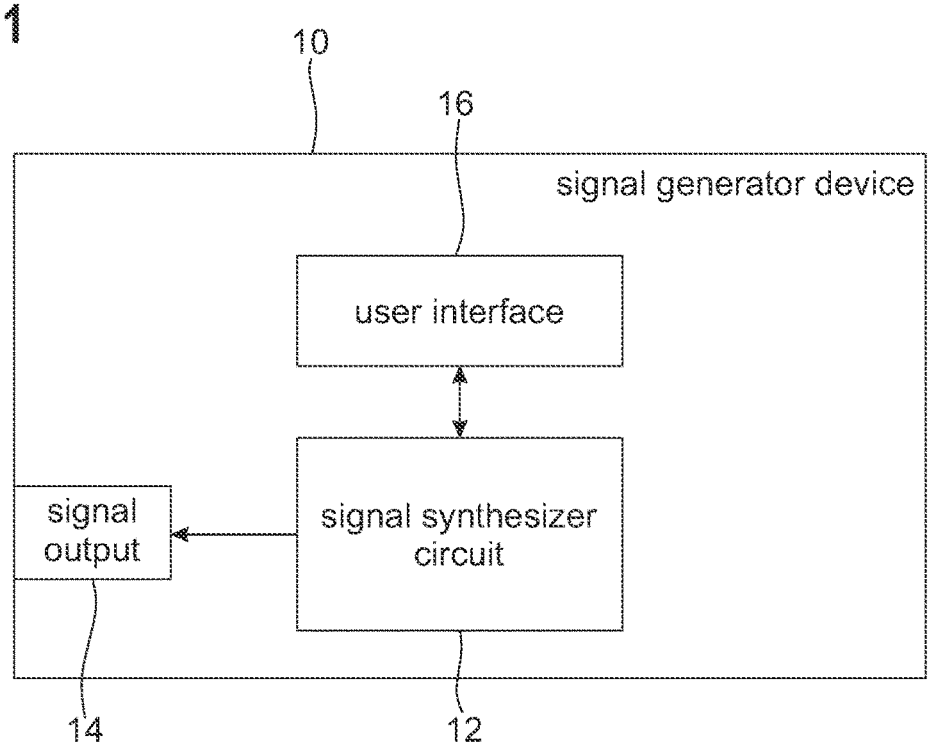
FIG. 1 schematically shows a signal generator device according to the present disclosure.

FIG. 1 schematically shows a signal generator device 10. The signal generator device 10 may be a standalone instrument, i.e. a dedicated electronic device for generating arbitrary signals.

Alternatively, the signal generator device 10 may be an integrated signal generator. In other words, the signal generator device 10 may be an electronic component of an electronic device, for example of a measurement instrument such as an oscilloscope, a vector network analyzer, or a signal analyzer.

The signal generator device 10 comprises a signal synthesizer circuit 12 being configured to generate an output signal by a signal synthesis method, and a signal output 14 being connected to the signal synthesizer circuit 12 for outputting the output signal generated by the signal synthesizer circuit 12.

The signal generator device 10 further comprises a user interface 16, wherein a user of the signal generator device 10 may adapt settings of the signal generator device 10 or rather of the signal synthesizer circuit 12 by the user interface 16, as will be described in more detail below.

Figure 2:
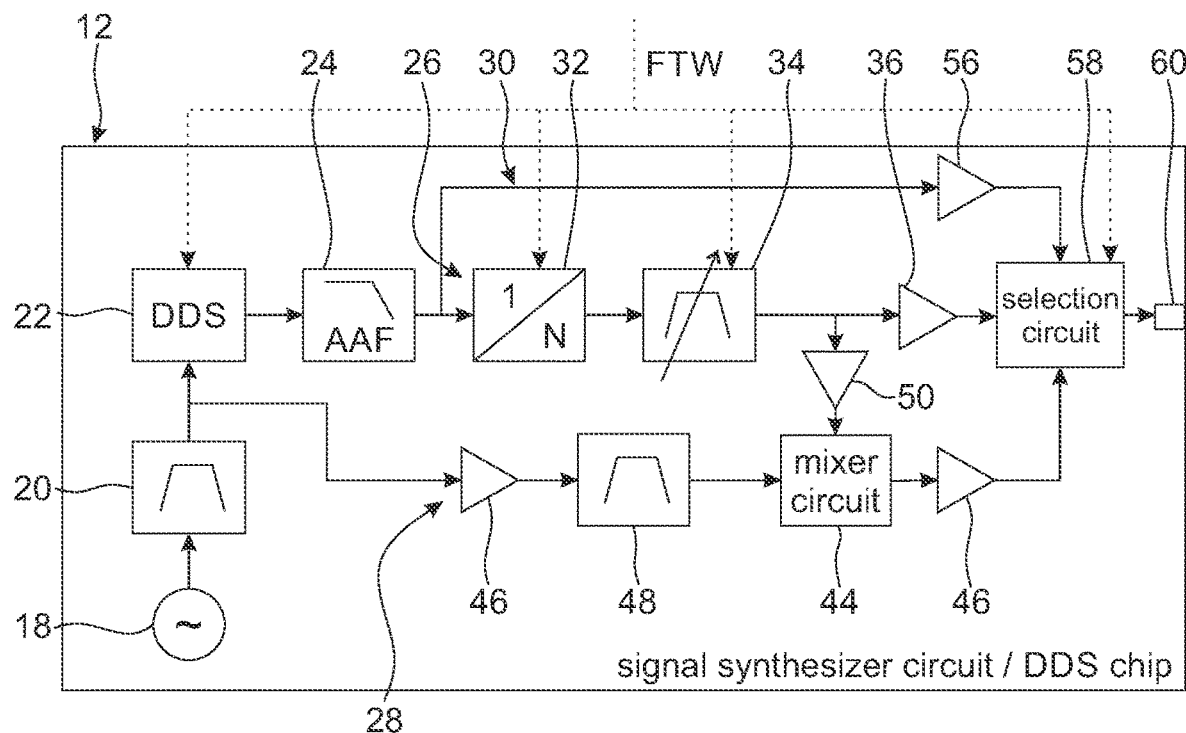
FIG. 2 schematically shows a signal synthesizer circuit according to the present disclosure.

FIG. 2 shows the signal synthesizer circuit 12 in more detail. As is indicated by the label "DDS" chip, the signal synthesizer circuit 12 is at least partially integrated on a single chip, particularly completely.

Alternatively, the signal synthesizer circuit 12 may be integrated on a multi-carrier module.

The signal synthesizer circuit 12 comprises a clock source 18 that is configured to generate or receive a clock signal having a frequency f_clk.

Accordingly, the clock source 18 may be an internal clock source generator circuit of the signal synthesizer circuit 12, i.e. the clock source 18 may be configured to generate the clock signal. For example, the clock source 18 may be a voltage-controlled oscillator (VCO).

Alternatively, the clock source 18 may be an input interface being configured to receive the clock signal from an external clock signal generator circuit.

Optionally, a bandpass filter 20 is provided immediately downstream of the clock source 18 that is configured to pre-filter the clock signal.

The signal synthesizer circuit 12 further comprises a direct digital synthesis (DDS) circuit 22 that is connected to the clock source 18 so as to receive the clock signal.

In general, the DDS circuit 22 is configured to generate a DDS signal based on the clock signal, wherein the DDS signal has a frequency f_DDS=n·f_clk.

Therein, n is a natural number between 0 and 1, particularly between 0 and a maximum value n_max=0.4 of n.

The frequency of the DDS signal may be controlled by a frequency tuning word (FTW), wherein the frequency of the DDS signal is equal to $f\_DDS=((FTW) \cdot f\_clk)/2^M$, wherein M is an integer and the FTW has possible (discrete) values between 0 and (M−1). Accordingly, n may be equal to $FTW/2^M$.

For example, the user may set the FTW via the user interface 16 of the signal generator device 10. As another example, the user may set a desired frequency via the user interface 16, and the FTW may be generated automatically based on the set desired frequency.

Downstream of the DDS circuit 22, an anti-aliasing filter 24 is provided that is configured to remove aliasing effects from the DDS signal generated by the DDS circuit 22.

The signal synthesizer circuit 12 further comprises three different signal paths, namely a first signal path 26, a second signal path 28, and a third signal path 30.

The first signal path 26 is connected to the anti-aliasing filter 24 so as to receive the DDS signal generated by the DDS circuit 22.

The first signal path 26 comprises a multiplier circuit 32 and, optionally, a tunable bandpass filter 34 that is provided downstream of the multiplier circuit 32.

Optionally, the first signal path 26 further comprises an amplifier 36 that is provided downstream of the multiplier circuit 32, particularly downstream of the tunable bandpass filter 34.

In general, the multiplier circuit 32 is configured to multiply the frequency of the DDS signal by a multiplication factor N, thereby obtaining a frequency-multiplied DDS signal having a frequency f_mult=N·n·f_clk.

With the optional tunable bandpass filter 34, predefined harmonics of the frequency-multiplied DDS signal and/or predefined subharmonics of the frequency-multiplied DDS signal may be suppressed.

Figure 3:
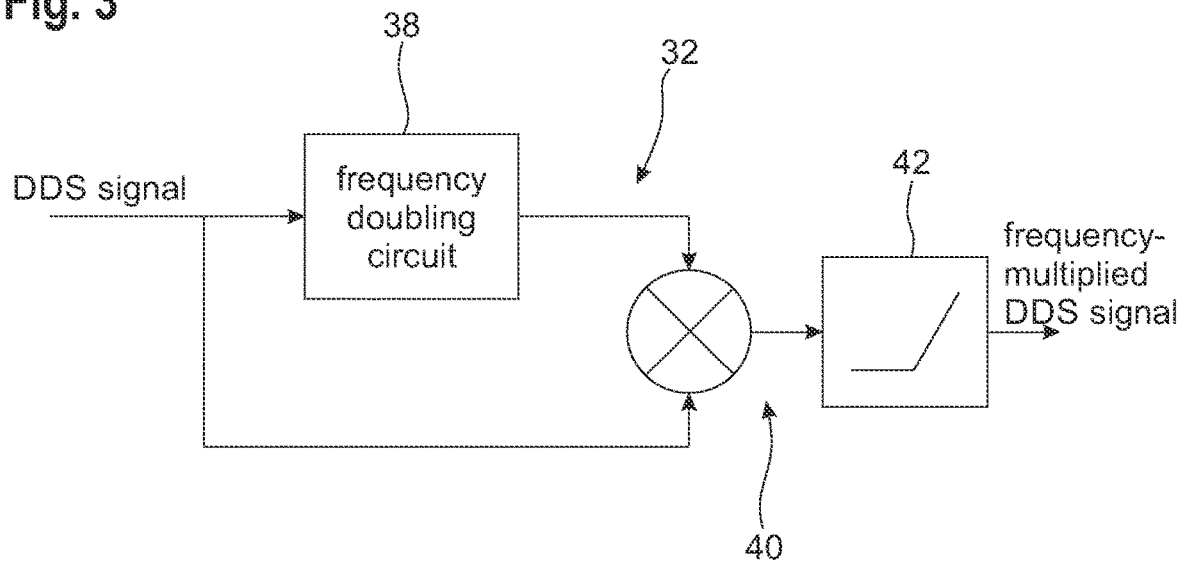
FIG. 3 schematically shows a multiplier circuit of the signal synthesizer circuit of FIG. 2.

One exemplary variant of the multiplier circuit 32 is shown in FIG. 3. The multiplier circuit 32 comprises a frequency doubling circuit 38 that is configured to double the frequency of the DDS signal, thereby obtaining a frequency-doubled DDS signal. The multiplier circuit 32 further comprises a mixer sub-circuit 40 that is configured to mix the DDS signal with the frequency-doubled DDS signal, thereby obtaining the frequency-multiplied DDS signal.

By mixing the frequency-doubled DDS signal having frequency 2f_DDS with the DDS signal having frequency f_DDS, two signals having frequencies f_DDS and 3f_DDS are obtained. The signal having the frequency [3]_DDS is selected by an appropriately configured highpass filter 42 (or bandpass filter) of the mixer sub-circuit 40.

Accordingly, in the exemplary embodiment of the multiplier circuit 32 shown in FIG. 3, the multiplication factor N is equal to 3.

However, it is to be understood that the multiplier circuit may be established in any other suitable way with any other multiplication factor N greater than 1, particularly greater than 2.

The second signal path 28 comprises a mixer circuit 44 being connected to the clock source 18 so as to receive the clock signal from the clock source 18.

The mixer circuit 44 is further connected to the multiplier circuit 32, particularly downstream of the tunable bandpass filter 34, so as to receive the frequency-multiplied DDS signal.

Optionally, the second signal path 28 comprises amplifiers 46 upstream and/or downstream of the mixer circuit 44.

Optionally, the second signal path 28 may further comprise a clock bandpass filter 48 upstream of the mixer circuit 44.

Optionally, a further amplifier 50 may be provided between the multiplier circuit 32 and the mixer circuit 44, particularly immediately upstream of the mixer circuit 44, wherein the frequency-multiplied DDS signal received by the mixer circuit 44 may be amplified by the further amplifier 50.

Figure 4:
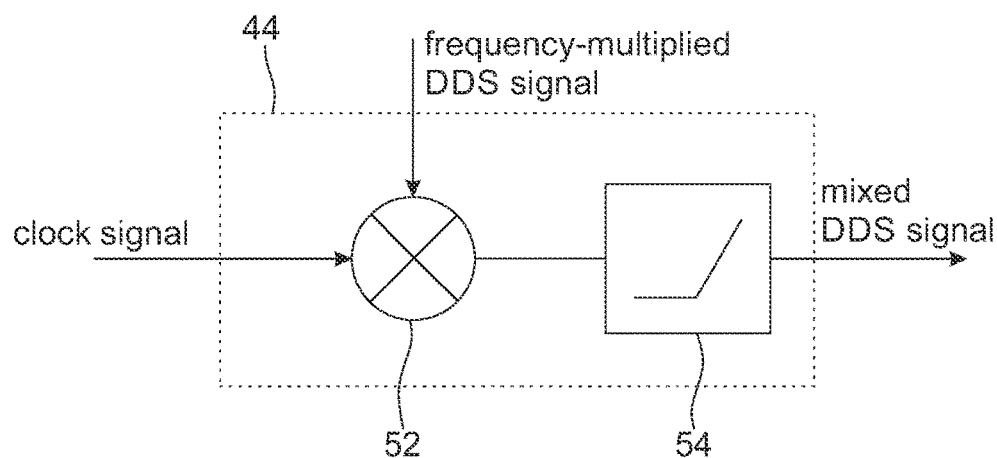
FIG. 4 schematically shows a mixer circuit of the signal synthesizer circuit of FIG. 2.

The mixer circuit 44 is shown in more detail in FIG. 4. The mixer circuit 44 comprises a mixer unit 52 and a mixer highpass filter 54, which may alternatively be established as a suitably configured bandpass filter.

The mixer unit 52 is configured to mix the frequency-multiplied DDS signal with the clock signal. Thereby, two signals having frequencies f_1=|f_mult−f_clk | and f_2=f_mult+f_clk are obtained.

The mixer highpass filter 54 removes the signal having frequency f_1, thereby obtaining the mixed DDS signal having frequency f_mix=f_mult+f_clk=(1+N·n) f_clk.

As is shown in FIG. 1, the third signal path 30 is connected to the DDS circuit 22 downstream of the anti-aliasing filter 24 so as to receive the DDS signal.

Optionally, the third signal path 30 comprises an amplifier 56 being configured to adapt a gain of the DDS signal.

The signal synthesizer circuit 12 further comprises a selection circuit 58 being connected to the signal paths 26, 28, 30. Moreover, the signal synthesizer circuit comprises at least one output 60.

In general, the selection circuit 58 is configured to selectively forward the DDS signal, the frequency-multiplied DDS signal, and/or the mixed DDS signal to the at least one output 60.

The selection circuit 58 may, for example, be configured as a switch or as a combiner with appropriate frequency suppression, such that only the desired signal(s) is (are) forwarded to the at least one output 60.

Alternatively, the selection circuit 58 may be configured to selectively deactivate any one or more of the amplifiers 36, 46, 50, 56 by setting their respective gain to −∞dBFS.

Accordingly, the at least one output 60 receives the DDS signal having frequency f_DDS=[ n·f ]_clk, the frequency-multiplied DDS signal having frequency f_mult=N·n·f_clk, and/or the mixed DDS signal having frequency f_mix=(1+N·n) f_clk.

Figure 5:
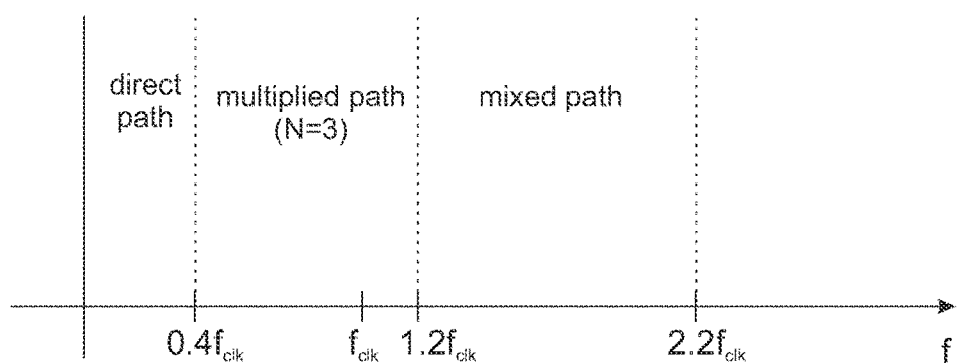
FIG. 5 shows a diagram illustrating possible frequency ranges of an output signal of the signal synthesizer circuit of FIG. 2.

As is illustrated in FIG. 5 for the exemplary case of N=3 and a maximum value for n being n_max=0.4, these three signals together cover the complete frequency spectrum from 0 to (1+N·n_max) f_clk, which is equal to 2.2 f_clk in the example shown in FIG. 5.

A user may select the frequency to be generated via the user interface 16, and a corresponding FTW may be generated.

In general, the DDS circuit 22, the multiplier circuit 32, the tunable bandpass filter 34, and/or the selection circuit 58 are controlled based on the FTW, such that an appropriate output signal having the selected frequency is generated and forwarded to the at least one output 60.

There are essentially three cases that are described in the following with reference to FIG. 5.

If the output signal shall have a frequency between 0 and n_max f_clk, the DDS signal having the appropriate frequency f_DDS=n·f_clk is generated. The generated DDS signal is forwarded to the at least one output 60 via the third signal path 30 and the selection circuit 58. This corresponds to the "direct path" shown in FIG. 5.

If the output signal shall have a frequency between n_max f_clk and N·n_max f_clk, the frequency-multiplied signal having the appropriate frequency f_mult=N·n·f_clk is generated as described above. The generated frequency-multiplied DDS signal is forwarded to the at least one output 60 via the first signal path 26 and the selection circuit 58. This corresponds to the "multiplied path" shown in FIG. 5.

If the output signal shall have a frequency between N·n_max f_clk and (1+N·n_max) f_clk, the mixed DDS signal having the appropriate frequency (1+N·n) f_clk is generated as described above and forwarded to the at least one output 60 via the second signal path 28 and the selection circuit 58.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

Various embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations. Various embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

What is claimed is:

1. A signal synthesizer circuit, comprising:
   a clock source, a direct digital synthesizer (DDS) circuit, a first signal path, a second signal path, an output being connected to the first signal path and the second signal path, and a selection circuit, wherein the first signal path is arranged in parallel to the second signal path, wherein the clock source is configured to generate or receive a clock signal having a predefined frequency, wherein the DDS circuit is configured to receive the clock signal and to generate a DDS signal based on the clock signal, wherein the first signal path is connected to the DDS circuit so as to receive the DDS signal generated based on the clock signal, wherein the first signal path comprises a multiplier circuit being configured to multiply a frequency of the DDS signal by a multiplication factor, thereby obtaining a frequency-multiplied DDS signal, wherein the second signal path is connected to the clock source so as to receive the clock signal, wherein the clock signal received by the second signal path is the same clock signal that is received by the DDS circuit, wherein the second signal path comprises a mixer circuit being connected to the clock source and to the multiplier circuit so as to receive the clock signal and the frequency-multiplied DDS signal, wherein the mixer circuit is configured to mix the clock signal with the frequency-multiplied DDS signal, thereby obtaining a mixed DDS signal, wherein a frequency of the mixed DDS signal corresponds to the sum of frequencies of the clock signal received by the second signal path and of the frequency-multiplied DDS signal, wherein the selection circuit is connected to both the first signal path and the second signal path, and wherein the selection circuit is configured to selectively forward the mixed DDS signal and/or the frequency-multiplied DDS signal to the output.

2. The signal synthesizer circuit of claim 1, wherein the multiplication factor is greater than 2.

3. The signal synthesizer circuit of claim 1, wherein the multiplication factor is equal to 3.

4. The signal synthesizer circuit of claim 1, wherein a frequency of the DDS signal is equal to or smaller than 40% of a frequency of the clock signal.

5. The signal synthesizer circuit of claim 1, wherein the first signal path comprises an anti-aliasing filter downstream of the DDS circuit.

6. The signal synthesizer circuit of claim 1, wherein the first signal path comprises a bandpass filter downstream of the multiplier circuit, wherein the bandpass filter is configured to suppress predefined harmonics and/or predefined subharmonics of the frequency-multiplied DDS signal.

7. The signal synthesizer circuit of claim 6, wherein the bandpass filter is tunable.

8. The signal synthesizer circuit of claim 1, wherein the second signal path comprises a clock bandpass filter upstream of the mixer circuit.

9. The signal synthesizer circuit of claim 1, wherein the mixer circuit comprises a mixer bandpass filter being configured to select the mixed DDS signal, or a mixer highpass filter being configured to select the mixed DDS signal.

10. The signal synthesizer circuit of claim 1, wherein the signal synthesizer circuit further comprises a third signal path connecting the DDS circuit to the output.

11. The signal synthesizer circuit of claim 10, wherein the selection circuit is configured to selectively forward the DDS signal, the mixed DDS signal, and/or the frequency-multiplied DDS signal to the output.

12. The signal synthesizer circuit of claim 1, wherein the DDS signal generated by the DDS circuit is adaptable.

13. The signal synthesizer circuit of claim 1, wherein the signal synthesizer circuit is integrated on a chip or on a multi-carrier module.

14. The signal synthesizer circuit of claim 1, wherein the clock source comprises a voltage-controlled oscillator.

15. The signal synthesizer circuit of claim 1, wherein the multiplier circuit comprises a frequency doubling circuit and a mixer sub-circuit, wherein the frequency doubling circuit is configured to double the frequency of the DDS signal, thereby obtaining a frequency-doubled DDS signal, and wherein the mixer sub-circuit is configured to mix the DDS signal with the frequency-doubled DDS signal, thereby obtaining the frequency-multiplied DDS signal.

16. A signal generator device, the signal generator device comprising a signal synthesizer circuit according to claim 1.

17. A signal synthesis method, comprising:
generating or receiving, by a clock source, a clock signal having a predefined frequency;
receiving, by a direct digital synthesizer (DDS) circuit, the clock signal;
generating, by the DDS circuit, a DDS signal based on the clock signal;
multiplying, by a multiplier circuit being arranged in a first signal path, a frequency of the DDS signal by a multiplication factor, thereby obtaining a frequency-multiplied DDS signal;
receiving, by a mixer circuit being arranged in a second signal path that is arranged in parallel to the first signal path, both the clock signal and the frequency-multiplied DDS signal, wherein the clock signal received by the mixer circuit is the same clock signal that is received by the DDS circuit; and
mixing, by the mixer circuit, the clock signal with the frequency-multiplied DDS signal, thereby obtaining a mixed DDS signal, wherein a frequency of the mixed DDS signal corresponds to the sum of the frequencies of the clock signal and of the frequency-multiplied DDS signal.

18. The signal synthesis method of claim 17, wherein the DDS signal, the frequency-multiplied DDS signal, and/or the mixed DDS signal are selectively forwarded to an output by a selection circuit.

19. The signal synthesis method of claim 17, wherein the multiplication factor is equal to 3.

20. A signal synthesizer circuit, comprising:
a clock source, a direct digital synthesizer (DDS) circuit, a first signal path, a second signal path, and an output being connected to the first signal path and the second signal path,
wherein the first signal path is arranged in parallel to the second signal path,
wherein the clock source is configured to generate or receive a clock signal having a predefined frequency,
wherein the DDS circuit is configured to receive the clock signal and to generate a DDS signal based on the clock signal,
wherein the first signal path is connected to the DDS circuit so as to receive the DDS signal generated based on the clock signal, wherein the first signal path comprises a multiplier circuit being configured to multiply a frequency of the DDS signal by a multiplication factor, thereby obtaining a frequency-multiplied DDS signal,
wherein the second signal path is connected to the clock source so as to receive the clock signal, wherein the clock signal received by the second signal path is the same clock signal that is received by the DDS circuit, wherein the second signal path comprises a mixer circuit being connected to the clock source and to the multiplier circuit so as to receive the clock signal and the frequency-multiplied DDS signal, wherein the mixer circuit is configured to mix the clock signal with the frequency-multiplied DDS signal, thereby obtaining a mixed DDS signal, wherein a frequency of the mixed DDS signal corresponds to the sum of frequencies of the clock signal received by the second signal path and of the frequency-multiplied DDS signal.

* * * * *